United States Patent
Jeong (10) Patent No.: US 9,960,291 B2
(45) Date of Patent: May 1, 2018

(54) SOLAR CELL

(71) Applicant: LG INNOTEK CO., LTD., Seoul (KR)

(72) Inventor: Jong Seon Jeong, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 22 days.

(21) Appl. No.: 14/892,177

(22) PCT Filed: Jun. 17, 2014

(86) PCT No.: PCT/KR2014/005318
§ 371 (c)(1),
(2) Date: Nov. 18, 2015

(87) PCT Pub. No.: WO2014/204182
PCT Pub. Date: Dec. 24, 2014

(65) Prior Publication Data
US 2016/0104807 A1    Apr. 14, 2016

(30) Foreign Application Priority Data

Jun. 20, 2013 (KR) .................. 10-2013-0070737

(51) Int. Cl.
H01L 31/042 (2014.01)
H01L 31/0224 (2006.01)
H01L 31/0463 (2014.01)

(52) U.S. Cl.
CPC .. *H01L 31/022425* (2013.01); *H01L 31/0463* (2014.12); *Y02E 10/50* (2013.01)

(58) Field of Classification Search
CPC ......... H01L 31/0463; H01L 31/022425; Y02E 10/50

USPC ................................. 136/243–265
See application file for complete search history.

(56) References Cited

U.S. PATENT DOCUMENTS

2007/0131271 A1   6/2007  Lim et al.
2008/0216895 A1   9/2008  Aoki et al.
2011/0265848 A1  11/2011  Ahn et al.
2011/0312124 A1  12/2011  Lee et al.
(Continued)

FOREIGN PATENT DOCUMENTS

CN   1983568 A   6/2007
CN   102576762 A  7/2012
(Continued)

OTHER PUBLICATIONS

SIPO Office Action for Chinese Application No. 201480035545.4 which corresponds to the above-referenced U.S. application, dated Nov. 15, 2016.
(Continued)

*Primary Examiner* — Niki Bakhtiari
(74) *Attorney, Agent, or Firm* — LRK Patent Law Firm (57) ABSTRACT

A solar cell includes a support substrate; a back electrode layer on the a support substrate; a light absorbing layer on the back electrode layer; a buffer layer on the light absorbing layer; a front electrode layer on the buffer layer; and a fourth through hole formed through the back electrode layer, the light absorbing layer, the buffer layer and the front electrode layer, wherein at least a portion of the fourth through hole is inclined with respect to a top surface of the support substrate.

8 Claims, 6 Drawing Sheets (56) References Cited

U.S. PATENT DOCUMENTS

| | | | |
|---|---|---|---|
| 2012/0094425 A1 | 4/2012 | Ghandour et al. | |
| 2012/0111405 A1* | 5/2012 | Cho | H01L 31/022425 |
| | | | 136/256 |
| 2013/0037099 A1 | 2/2013 | Lee | |
| 2013/0056758 A1* | 3/2013 | Ziltener | H01L 31/0296 |
| | | | 257/88 |

FOREIGN PATENT DOCUMENTS

| | | |
|---|---|---|
| CN | 103081123 A | 5/2013 |
| JP | 2007-317858 A | 12/2007 |
| JP | 2007-317879 A | 12/2007 |
| KR | 10-2011-0137671 A | 12/2011 |
| KR | 10-2012-0026925 A | 3/2012 |
| KR | 10-2012-0044256 A | 5/2012 |
| KR | 10-2012-0090250 A | 8/2012 |
| KR | 10-2012-0129108 A | 11/2012 |
| WO | wo2011/148346 * | 12/2011 |

OTHER PUBLICATIONS

Search Report for International Application No. PCT/KR2014/005318, dated Oct. 27, 2014.

* cited by examiner

SOLAR CELL

TECHNICAL FIELD

The embodiment relates to a solar cell.

BACKGROUND ART

Recently, concerns about the environmental pollution and depletion of natural resources have been increased, so a solar cell is spotlighted as an alternative energy source having high energy efficiency without the problem of environmental pollution. The solar cell is classified into a silicon semiconductor solar cell, a compound semiconductor solar cell, and a stack-type solar cell depending on the composition of the solar cell. A solar cell including a CIGS light absorbing layer according to the embodiment may belong to the compound semiconductor solar cell.

The CIGS, which is a group I-III-VI compound semiconductor, has a direct transition energy bandgap of 1 eV or more as well as the highest light absorbing coefficient among the semiconductors. The CIGS has very stable electro-optic characteristics, so the CIGS is an ideal material for a light absorbing layer of the solar cell.

The solar cell is manufactured by sequentially depositing a substrate, a back electrode layer, a light absorbing layer, a buffer layer and a front electrode layer. In addition, the solar cell has a first through hole for shorting the back electrode layer, a second through hole for shorting the light absorbing layer and the buffer layer, a third through hole for shorting the front electrode layer and a fourth through hole for shorting an edge part.

The fourth through hole for shorting the edge part can be formed by a laser etching or by performing a mechanical etching using a needle after performing the laser etching.

However, in the case of the laser etching, the front electrode layer may be melted due to high energy of laser, so the front electrode layer may come into contact with the back electrode layer, thereby causing the short. In addition, the process step may be added in the two-step process, so the process efficiency may be lowered.

Therefore, it is necessary to provide a solar cell having a novel structure, in which the fourth through hole can be more efficiently formed.

DISCLOSURE

Technical Problem

The embodiment provides a solar cell having a novel structure which includes a fourth through hole having an inclined surface.

Technical Solution

According to the first embodiment, there is provided a solar cell including a support substrate; a back electrode layer on the a support substrate; a light absorbing layer on the back electrode layer; a buffer layer on the light absorbing layer; a front electrode layer on the buffer layer; and a fourth through hole formed through the back electrode layer, the light absorbing layer, the buffer layer and the front electrode layer, wherein the fourth through hole is inclined with respect to a top surface of the support substrate.

According to the second embodiment, there is provided a solar cell including a support substrate; a back electrode layer on the a support substrate; a light absorbing layer on the back electrode layer; a front electrode layer on the light absorbing layer; and a fourth through hole formed through the back electrode layer, the light absorbing layer, and the front electrode layer, wherein the fourth through hole includes a first surface perpendicular to the top surface of the support substrate; and a second surface extending from the first surface and inclined with respect to the top surface of the support substrate.

Advantageous Effects

In the solar cell according to the first embodiment, the fourth through holes are inclined by a predetermined inclination angle with respect to the top surface of the support substrate.

According to the related art, the fourth through holes are formed perpendicular to a top surface of the support substrate like the first to third through holes. In this case, the fourth through holes are formed through a laser etching or the fourth through holes are formed by performing a mechanical etching using a needle after performing the laser etching.

However, if the laser etching or the laser etching and mechanical etching are performed according to the related art, the front electrode layer may be melted due to high energy of laser, so the front electrode layer may come into contact with the back electrode layer disposed under the front electrode layer, thereby causing the short. In addition, if the fourth through holes are formed by the primary and secondary etchings, the process step may be increased, so the process efficiency may be lowered.

For this reason, according to the solar cell of the first embodiment, inner surfaces of the fourth holes are inclined when the fourth holes are formed.

Therefore, a spacing distance between the front electrode layer and the back electrode layer may be increased, so that the front electrode layer may not come into contact with the back electrode layer even if the front electrode layer is partially melted due to the high energy of laser, thereby preventing the short between the front electrode layer and the back electrode layer.

In the solar cell according to the second embodiment, the fourth through holes include first surfaces perpendicular to the top surface of the support substrate and second surfaces inclined by a predetermined inclination angle with respect to the top surface of the support substrate.

Thus, according to the solar cell of the second embodiment, inner surfaces of the fourth holes are partially inclined when the fourth holes are formed.

Therefore, a spacing distance between the front electrode layer and the back electrode layer may be increased, so that the front electrode layer may not come into contact with the back electrode layer even if the front electrode layer is partially melted due to the high energy of laser, thereby preventing the short between the front electrode layer and the back electrode layer.

In addition, a dead zone area can be diminished, so that the efficiency of the solar cell can be improved.

BEST MODE

Mode for Invention

In the description of the embodiments, it will be understood that, when a layer (film), a region, a pad or a pattern is referred to as being "on" or "under" another layer (film), another region, another pad or another pattern, it can be "directly" or "indirectly" on another layer (film), another region, another pad or another pattern or one or more intervening layers may also be present. Such a position of the layer has been described with reference to the drawings.

The size or the thickness of the layer (film), the region, the pattern or the structure may be modified for the purpose of explanation and clarity. The size may not utterly reflect the actual size.

Hereinafter, an exemplary embodiment of the disclosure will be described with reference to the accompanying drawings.

Figure 1:
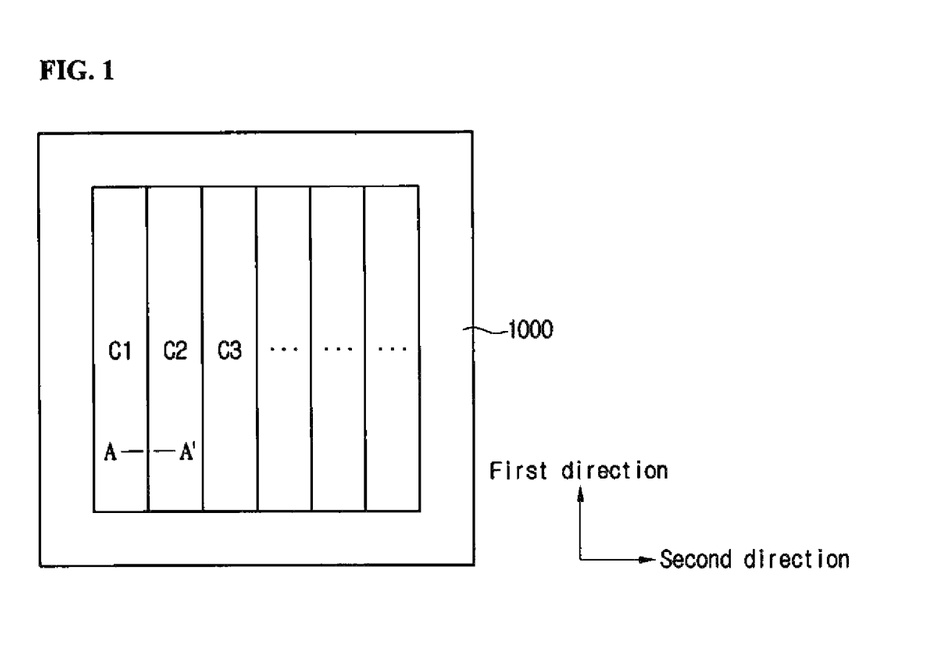
FIG. 1 is a plan view showing a solar cell according to the embodiment.
Figure 2:
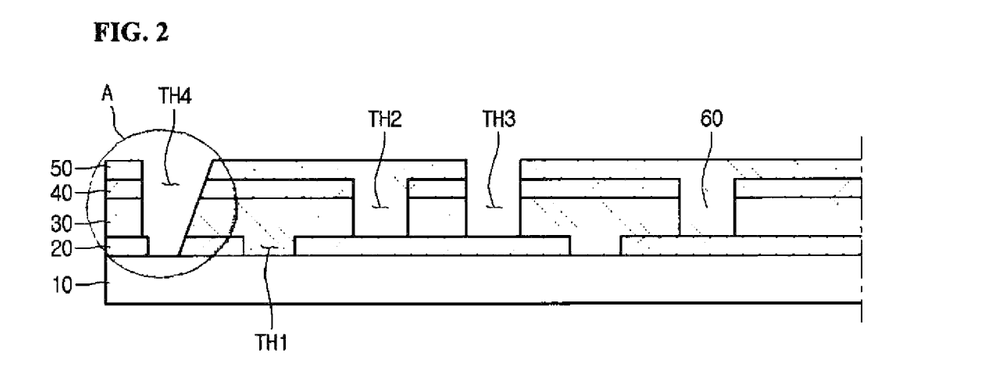
FIG. 2 is a sectional view showing one section of a solar cell according to the first embodiment.
Figure 3:
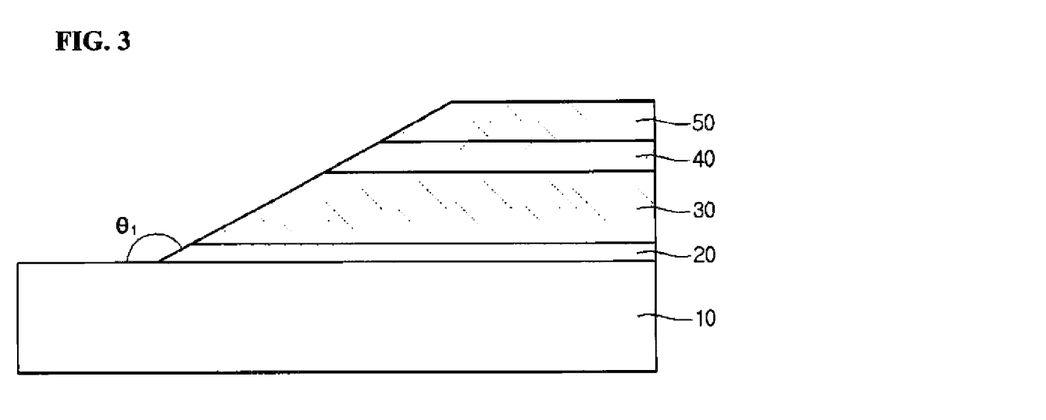
FIGS. 3 and 4 are views showing a section of a fourth through hole of a solar cell according to the first embodiment.
Figure 4:
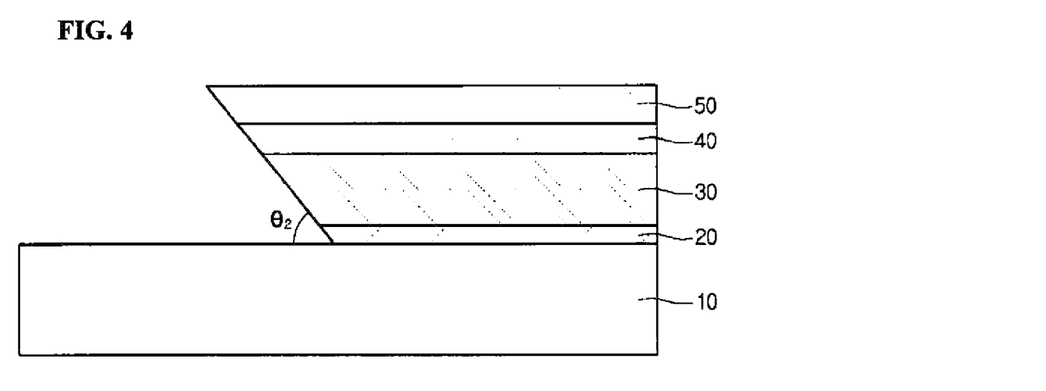
Figure 5:
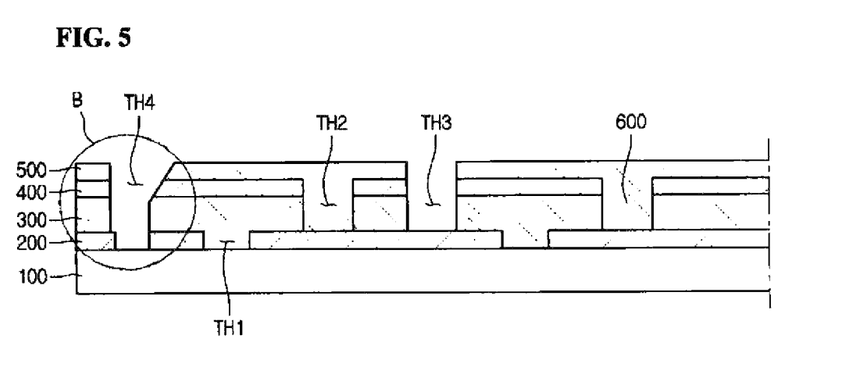
FIG. 5 is a sectional view showing one section of a solar cell according to the second embodiment.
Figure 6:
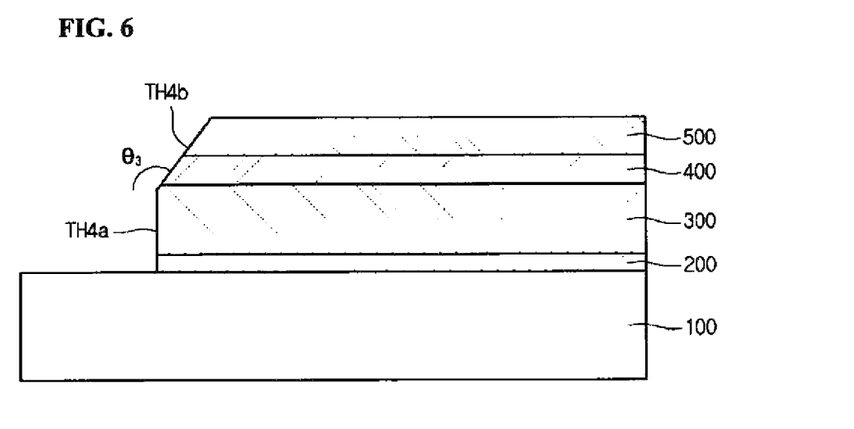
FIG. 6 is a view showing a section of a fourth through hole of a solar cell according to the second embodiment.

FIG. 1 is a plan view showing a solar cell according to the embodiment, FIG. 2 is a sectional view showing one section of a solar cell according to the first embodiment, FIGS. 3 and 4 are views showing a section of a fourth through hole of a solar cell according to the first embodiment, FIG. 5 is a sectional view showing one section of a solar cell according to the second embodiment, FIG. 6 is a view showing a section of a fourth through hole of a solar cell according to the second embodiment.

Referring to FIGS. 1 to 4, the solar cell according to the first embodiment may include a support substrate 10, a back electrode layer 20, a light absorbing layer 30, a buffer layer 40, a front electrode layer 50 and a plurality of connection parts 60.

The support substrate 10 has a plate shape, and supports the back electrode layer 20, the light absorbing layer 30, the buffer layer 40, the front electrode layer 50 and the connection parts 60.

The support substrate 10 may include an insulator. The support substrate 10 may be a glass substrate, a plastic substrate, or a metal substrate. In detail, the support substrate 10 may include soda lime glass. The support substrate 10 may be transparent. The support substrate 10 may be flexible or rigid.

The back electrode layer 20 may be provided on the support substrate 10. The back electrode layer 20 may be a conductive layer. For example, the back electrode layer 20 may include a metal, such as molybdenum (Mo).

In addition, the back electrode layer 20 may include at least two layers. In this case, the layers may be formed of the same metal or different metals.

The back electrode layer 20 is formed therein with first through holes TH1. The first through holes TH1 are open regions to expose the top surface of the support substrate 10. When viewed in a plan view, the first through holes TH1 may have the shape extending in the first direction.

Each of the first through holes TH1 may have the width in the range of about 80 μm to about 200 μm, but the embodiment is not limited thereto.

Accordingly, the back electrode layer 20 is divided into a plurality of back electrodes by the first through holes TH1. In other words, the back electrodes are defined by the first through holes TH1.

The back electrodes are spaced apart from each other by the first through holes TH1. The back electrodes are arranged in the shape of a stripe.

Alternatively, the back electrodes may be arranged in the shape of a matrix. In this case, when viewed in a plan view, the first through holes TH1 may be provided in the shape of a lattice.

The light absorbing layer 30 is disposed on the back electrode layer 20. Further, the first through holes TH1 are filled with the material included in the light absorbing, layer 30.

The light absorbing layer 30 includes group I-III-VI compounds. For instance, the light absorbing layer 30 may include the Cu (In,Ga)Se$_2$ (CIGS) crystal structure, the Cu(In)Se$_2$ crystal structure, or the Cu(Ga)Se$_2$ crystal structure.

The light absorbing layer 30 may have an energy bandgap in the range of about 1 eV to about 1.8 eV.

The buffer layer 40 is disposed on the light absorbing layer 30. In detail, the first buffer layer 40 may directly come into contact with the light absorbing layer 30.

The buffer layer 40 may be formed therein with second through holes TH2. The second through holes TH2 are open regions to expose the top surface of the back electrode layer 20. When viewed in a plan view, the second through holes TH2 may have the shape extending in one direction. Each of the second through holes TH2 may have the width in the range of about 80 μm to about 200 μm, but the embodiment is not limited thereto.

A plurality of buffer layers may be defined in the buffer layer 40 by the second through holes TH2.

The front electrode layer 50 is provided on the buffer layer 40. The front electrode layer 50 is transparent and includes a conductive layer. In addition, the front electrode layer 50 has resistance higher than that of the back electrode layer 20.

The front electrode layer 50 includes oxide. For example, a material constituting the front electrode layer 50 may include Al doped zinc oxide (AZO), indium zinc oxide (IZO), or indium tin oxide (ITO).

The front electrode layer 50 may include the connection parts 60 provided in the second through holes TH2.

The buffer layer 40 and the front electrode layer 50 are formed therein with third through holes TH3. The third through holes TH3 may be formed through a portion or an entire portion of the buffer layer 40 and the front electrode layer 50. In other words, the third through holes TH3 may expose the top surface of the back electrode layer 20.

The third through holes TH3 are formed adjacent to the second through holes TH2. In detail, the third through holes TH3 are provided beside the second through holes TH2. In other words, when viewed in a plan view, the third through holes TH3 are provided in parallel to the second through holes TH2. The third through holes TH3 may have the shape extending in the first direction.

The front electrode layer 50 is divided into a plurality of front electrodes by the third through holes TH3.

Each front electrode has a shape corresponding to the shape of each back electrode. In other words, the front electrodes are arranged in the shape of a stripe. Alternatively, the front electrodes may be arranged in the shape of a matrix.

In addition, a plurality of solar cells C1, C2, ..., and Cn are defined by the third through holes TH3. In detail, the solar cells C1, C2, ..., and Cn are defined by the second and third through holes TH2 and TH3. In other words, the solar cell according to the embodiment is divided into the solar cells C1, C2, ..., and Cn by the second and third through holes TH2 and TH3. In addition, the solar cells C1, C2, ..., and Cn are connected to each other in a second direction crossing the first direction. In other words, current may flow through the solar cells C1, C2, ..., and Cn in the second direction.

In other words, a solar cell panel 1000 includes the support substrate 10 and the solar cells C1, C2, ..., and Cn. The solar cells C1, C2, ..., and Cn are provided on the support substrate 10 and spaced apart from each other. The solar cells C1, C2, ..., and Cn are connected to each other in series by connection parts 60.

The connection parts 60 are provided inside the second through holes TH2. The connection parts 60 extend downward from the front electrode layer 50, so that the connection parts 60 are connected to the back electrode layer 20. For example, the connection parts 60 extend from the front electrode of the first cell C1 so that the connection parts 60 are connected to the back electrode of the second cell C2.

Therefore, the connection parts 60 connect adjacent solar cells to each other. In more detail, the connection parts 60 connect front and back electrodes of the adjacent solar cells to each other.

The connection parts 60 are integrally formed with the front electrode layer 50. In other words, a material constituting the connection parts 60 is the same as a material constituting the front electrode layer 50.

The fourth through, holes TH4 are formed in the front electrode layer 50. The fourth through holes TH4 are formed through the back electrode layer 20, the light absorbing layer 30 and the front electrode layer 50.

The fourth through holes TH4 expose the surface of the support substrate 10 and short the edge part of the solar cell with the outside.

As shown in FIGS. 3 and 4, inner surfaces of the fourth through holes TH4 are inclined with respect to the top surface of the support substrate 10.

In detail, the fourth through holes TH4 may be formed in the direction different from the direction of at least one of the first through holes TH1, the second through holes TH2 and the third through holes TH3. That is, at least one of the first through holes TH1, the second through holes TH2 and the third through holes TH3 may be formed in the perpendicular direction with respect to the top surface of the support substrate 10 and the fourth through holes TH4 may be formed in the direction different from the perpendicular direction.

Referring to FIG. 3, the fourth through holes TH4 may be inclined to have a width, which becomes wider from the support substrate 10 to the front electrode layer 50.

In this case, an inclination angle $\theta 1$ between the fourth through holes TH4 and the top surface of the support substrate 10 may be an obtuse angle. In detail, the inclination angle $\theta 1$ may be in the range of about 130° to about 170°. If the inclination angle $\theta 1$ is less than about 130°, the dead zone area may be enlarged so that the efficiency may be lowered and the laser etching may not be readily performed. In addition, if the inclination angle $\theta 1$ exceeds about 170°, the front electrode layer 50 may be melted by the laser, so the front electrode layer 50 makes contact with the back electrode layer 20, thereby causing the short.

Referring to FIG. 4, the fourth through holes TH4 may be inclined to have a width, which becomes narrower from the support substrate 10 to the front electrode layer 50.

In this case, an inclination angle $\theta 2$ between the fourth through holes TH4 and the top surface of the support substrate 10 may be an acute angle. In detail, the inclination angle $\theta 2$ may be in the range of about 40° to about 80°. If the inclination angle $\theta 2$ is less than about 40°, the dead zone area may be enlarged so that the efficiency may be lowered and the laser etching may not be readily performed. In addition, if the inclination angle $\theta 2$ exceeds about 80°, the front electrode layer 50 may be melted by the laser, so the front electrode layer 50 makes contact with the back electrode layer 20, thereby causing the short.

In the solar cell according to the first embodiment, the fourth through holes are inclined by a predetermined inclination angle with respect to the top surface of the support substrate.

According to the related art, the fourth through holes are formed perpendicular to the top surface of the support substrate like the first to third through holes. In this case, the fourth through holes are formed through a laser etching or the fourth through holes are formed by performing a mechanical etching using a needle after performing the laser etching.

However, if the laser etching or the laser etching and mechanical etching are performed according to the related art, the front electrode layer may be melted due to high energy of laser, so the front electrode layer may come into contact with the back electrode layer disposed under the front electrode layer, thereby causing the short. In addition, if the fourth through holes are formed by the primary and secondary etchings, the process step may be increased, so the process efficiency may be lowered.

For this reason, according to the solar cell of the first embodiment, inner surfaces of the fourth holes are inclined when the fourth holes are formed.

Therefore, a spacing distance between the front electrode layer and the back electrode layer may be increased, so that the front electrode layer may not come into contact with the back electrode layer even if the front electrode layer is partially melted due to the high energy of laser, thereby preventing the short between the front electrode layer and the back electrode layer.

Hereinafter, a solar cell according to the second embodiment will be described with reference to FIGS. 5 and 6. In the following description of the second embodiment, the description about the parts that have been described in the first embodiment will be omitted. That is, the description about the solar cell according to the first embodiment will be incorporated herein by reference.

Referring to FIGS. 5 and 6, the solar cell according to the second embodiment may include a support substrate 100, a back electrode layer 200, a light absorbing layer 300, a buffer layer 400, a front electrode layer 500 and a plurality of connection parts 600.

In addition, the solar cell according to the second embodiment includes first through holes TH1 formed through the back electrode layer, second through holes TH2 formed through the light absorbing layer, third through holes TH3 formed through the light absorbing layer and the front electrode layer and fourth through holes TH4 formed through the back electrode layer, the light absorbing layer and the front electrode layer.

The support substrate 100, the back electrode layer 200, the light absorbing layer 300, the buffer layer 400, the front electrode layer 500, the connection parts 600, and the first to third through holes are identical to those of the solar cell according to the first embodiment, so detailed description thereof will be omitted.

The solar cell according to the second embodiment is formed therein with fourth through holes TH4 that expose the surface of the support substrate 100 and short the edge part of the solar cell with the outside.

In detail, the fourth through holes TH4 may be formed in the direction different from the direction of at least one of the first through holes TH1, the second through holes TH2 and the third through holes TH3. That is, at least one of the first through holes TH1, the second through holes TH2 and the third through holes TH3 may be formed in the perpendicular direction with respect to the top surface of the support substrate 100 and the fourth through holes TH4 may be formed in the direction different from the perpendicular direction.

The fourth through holes TH4 may be partially inclined with respect to the top surface of the support substrate 100. In detail, the fourth through hole TH4 may include a first surface TH4a perpendicular to the top, surface of the support substrate 100 and a second surface TH4b inclined by a predetermined angle with respect to the top surface of the support substrate 100. In other words, inner surfaces of the fourth through hole TH4 may include the second surface TH4b, that is, an inclined surface partially inclined with respect to the support substrate 100.

The fourth through hole TH4 may have, a width, which becomes wider from the support substrate 100 to the front electrode layer 500. In detail, the width of the fourth through hole TH4 may be gradually enlarged in the direction from the support substrate 100 to the front electrode layer 500, starting from the second surface TH4b.

The second surface TH4b of the fourth through hole TH4, that is, the inclined surface of the fourth through hole TH4 is inclined by a predetermined angle with respect to the top surface of the support substrate 100. In detail, the second surface TH4b has an inclination angle θ3 in the range of about 130° to about 170° with respect to the support substrate 100.

The inclination angle θ3 may be in the range of about 130° to about 170°. If the inclination angle θ3 is less than about 130°, the dead zone area may be enlarged so that the efficiency may be lowered and the laser etching may not be readily performed. In addition, if the inclination angle θ3 exceeds about 170°, the front electrode layer 500 may be melted by the laser, so the front electrode layer 500 makes contact with the back electrode layer 200, thereby causing the short.

In the solar cell according to the second embodiment, the fourth through holes have the first surface perpendicular to the top surface of the support substrate and the second surface inclined with respect to the top surface of the support substrate.

Thus, according to the solar cell of the second embodiment, the inner surface of the fourth through hole is partially inclined by a predetermined inclination angle when the fourth through hole is formed.

Therefore, a spacing distance between the front electrode layer and the back electrode layer may be increased, so that the front electrode layer may not come into contact with the back electrode layer even if the front electrode layer is partially melted due to the high energy of laser, thereby preventing the short between the front electrode layer and the back electrode layer.

In addition, the dead zone area may be diminished, so that the efficiency of the solar cell can be improved.

Hereinafter, a method of fabricating the solar cell according to the embodiment will be described with reference to FIGS. 7 to 15. FIGS. 7 to 15 are views showing the method of fabricating the solar cell according to the embodiment. The reference numerals corresponding to the solar cell according to the second embodiment are denoted in the drawings for the purpose of convenience of explanation and the solar cell according to the first embodiment can be fabricated through the method of fabricating the solar cell according to the second embodiment.

Figure 7:
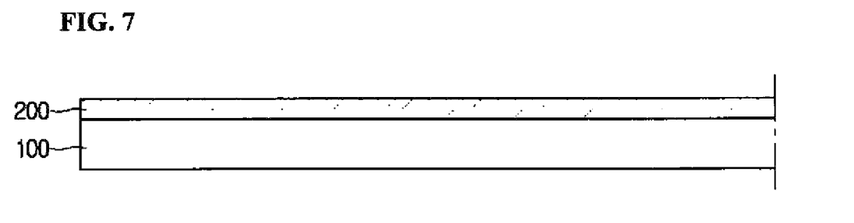
FIGS. 7 to 15 are views showing a method of fabricating a solar cell according to the embodiment.
Figure 8:
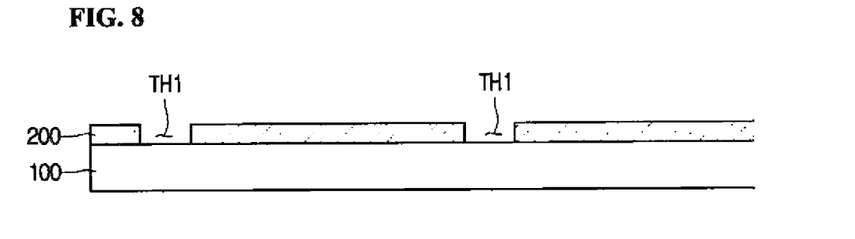

Referring to FIG. 7, the back electrode layer 200 is formed on the support substrate 100.

First through holes TH1 are formed by patterning the back electrode layer 200. Accordingly, a plurality of back electrodes and first and second connection electrodes are formed on the support substrate 100. The back electrode layer 200 is patterned by a laser.

The first through holes TH1 expose the top surface of the support substrate 100, and may have a width in the range of about 80 μm to about 200 μm, but the embodiment is not limited thereto.

Further, an additional layer such as a diffusion barrier layer may be interposed between the support substrate 100 and the back electrode layer 200. In this case, the first through holes TH1 expose a top surface of the additional layer.

Figure 9:
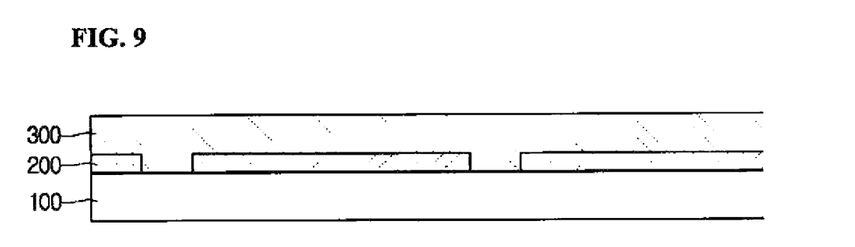
Figure 10:
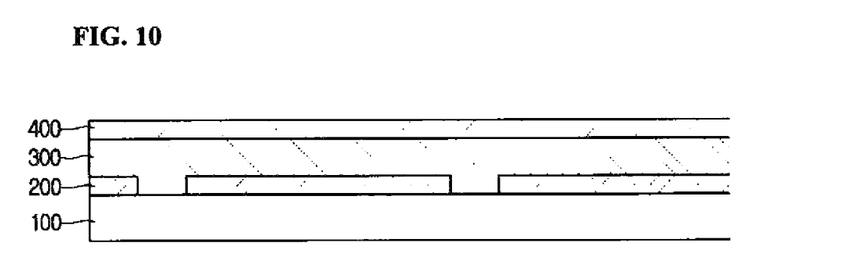

Next, as shown in FIG. 9, the light absorbing layer 300 is formed on the back electrode layer 200. The light absorbing layer 300 may be formed through a sputtering process or evaporation.

For instance, Cu, In, Ga and Se are simultaneously or independently evaporated to form the CIGS-based light absorbing layer 300, or the light absorbing layer 300 can be formed through the selenization process after forming a metal precursor layer.

In detail, when the selenization process is performed after forming the metal precursor layer, the metal precursor layer is formed on the back electrode layer 200 by performing the sputtering process using a Cu target, an In target, and a Ga target.

Then, the selenization process is performed to form the CIGS-based light absorbing layer 300 based on the metal precursor layer.

In addition, the sputtering process using the Cu target, the In target, and the Ga target and the selenization process can be simultaneously performed.

Moreover, a sputtering process and a selenization process may be performed to form a CIS or CIG-based light absorbing layer 300 using only the Cu target and the In target or only the Cu target and the Ga target.

Then, cadmium sulfide is deposited through the sputtering process or chemical bath deposition (CBD) so that the buffer layer 400 is formed.

The buffer layer may be obtained through chemical vapor deposition (CVD), metal organic chemical vapor deposition (MOCVD) or atomic layer deposition (ALD).

Figure 11:
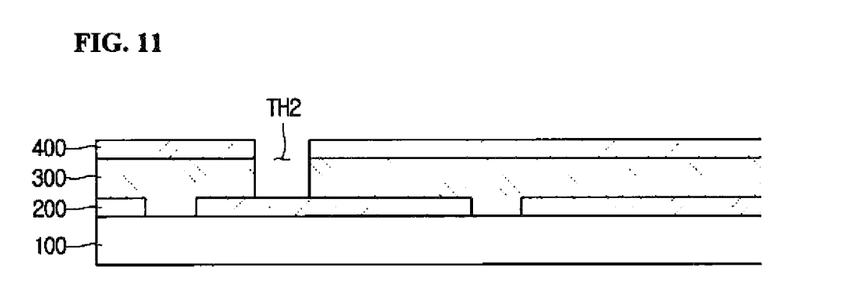

Next, referring to FIG. 11, second through holes TH2 are formed by partially removing the light absorbing layer 300 and the buffer layer 400.

The second through holes TH2 may be formed by using a mechanical device such as a tip or a laser device.

For example, the light absorbing layer 300 and the buffer layer 400 may be patterned by a tip having a width of about 40 μm to about 180 μm. In addition, the second through holes TH2 may be formed by a laser having a wavelength of about 200 nm to about 600 nm.

In this case, the second through holes TH2 may have the width of about 100 μm to about 200 μm. In addition, the second through holes TH2 expose a portion of the top surface of the back electrode layer 200.

Figure 12:
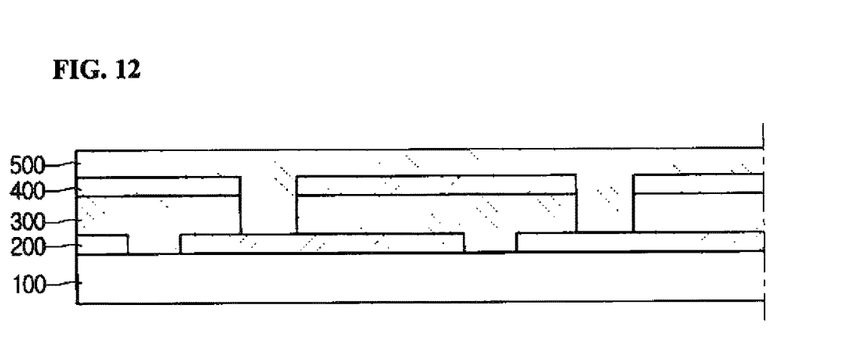

Thereafter, referring to FIG. 12, a transparent conducive material is deposited on the buffer layer 400 to form the front electrode layer 500.

The front electrode layer 500 may be formed by depositing the transparent conducive material in the oxygen-free atmosphere. In detail, the front electrode layer 500 may be formed by depositing Al-doped zinc oxide in the inert gas atmosphere containing no oxygen.

The front electrode layer 500 may be formed by depositing Al-doped zinc oxide through an RF sputtering process using a ZnO target, or by depositing Al-doped zinc oxide through a reactive sputtering process using a Zn target.

Figure 13:
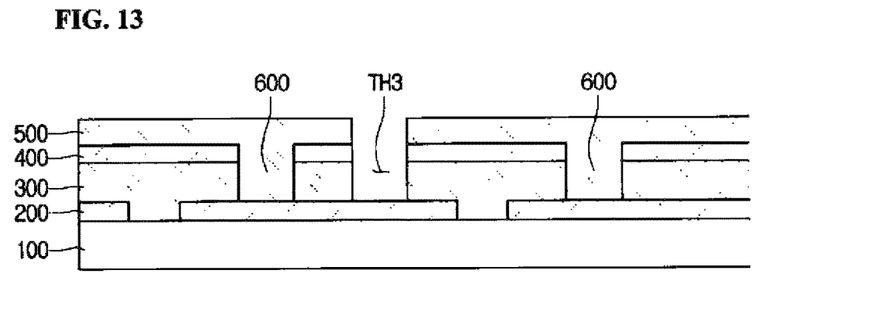

Thereafter, referring to FIG. 13, the third through holes TH3 are formed by partially removing the light absorbing layer 300, the buffer layer 400, and the front electrode layer 500. Therefore, the front electrode layer 500 is patterned to define a plurality of front electrodes and first to third cells C1 to C3. Each third through hole TH3 has the width of about 80 μm to about 200 μm, but the embodiment is not limited thereto.

Figure 14:
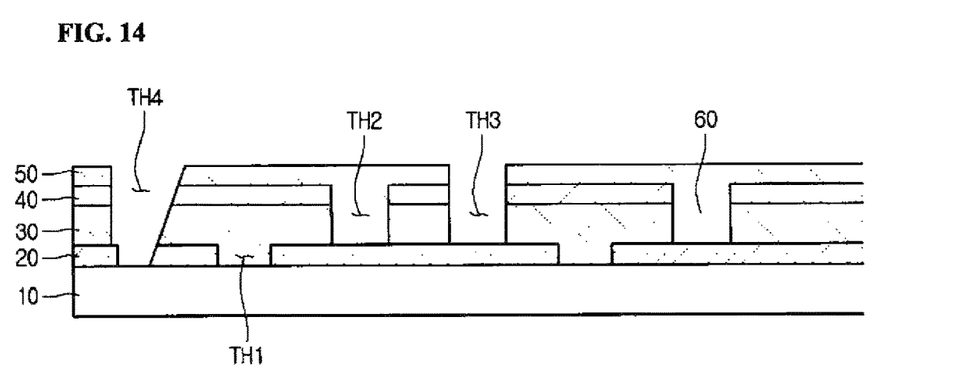

Then, referring to FIG. 14, the fourth through holes TH4 are formed by partially removing the back electrode layer 200, the light absorbing layer 300, the buffer layer 400, and the front electrode layer 500. Thus, the surface of the support substrate 100 is exposed, and the edge part of the solar cell is shorted with the outside.

The fourth through holes TH4 may be formed by irradiating laser. In this case, the layer is irradiated at a predetermined inclination angle with respect to the top surface of the support substrate 100. Thus, inner surfaces of the fourth through holes TH4 may be inclined by a predetermined inclination angle with respect to the top surface of the support substrate 100.

At this time, the inner surfaces of the fourth through holes TH4 are gradually narrowed or enlarged in the direction from the support substrate 100 to the front electrode layer. That is, the fourth through holes TH4 have the obtuse inclination angle or the acute inclination angle with respect to the top surface of the support substrate 100. For example, when the inner surfaces of the fourth through holes TH4 are gradually narrowed in the direction from the support substrate 100 to the front electrode layer, the fourth through holes TH4 have the inclination angle in the range of about 40° to about 80°. In addition, when the inner surfaces of the fourth through holes TH4 are gradually enlarged in the direction from the support substrate 100 to the front electrode layer, the fourth through holes TH4 have the inclination angle in the range of about 130° to about 170°.

Therefore, a spacing distance between the front electrode layer and the back electrode layer may be increased in the solar cell fabricated through the above method, so that the front electrode layer may not come into contact with the back electrode layer even if the front electrode layer is partially melted due to the high energy of laser, thereby preventing the short between the front electrode layer and the back electrode layer.

Figure 15:
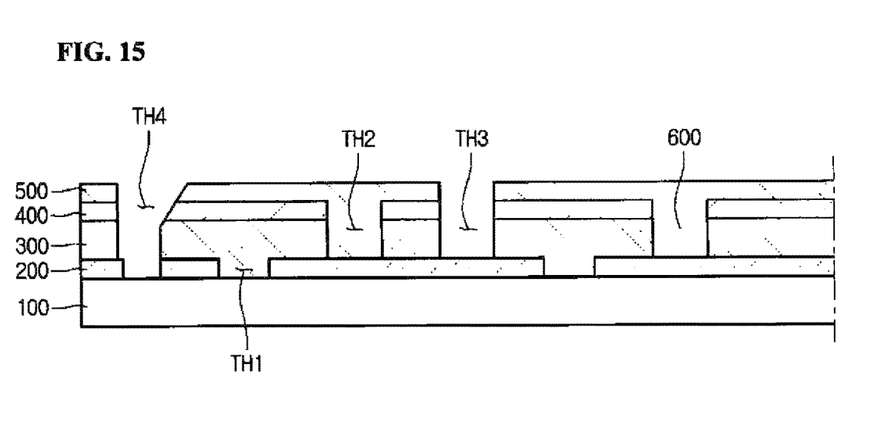

Referring to FIG. 15, different from FIG. 14, the fourth through holes TH4, which are partially inclined, are formed by partially removing the back electrode layer 200, the light absorbing layer 300, the buffer layer 400, and the front electrode layer 500. Thus, the surface of the support substrate 100 is exposed and the edge part of the solar cell is shorted with the outside.

The fourth through holes TH4 may be formed through the mechanical scheme by using a needle after irradiating the laser. In, this case, the laser is irradiated, in the direction perpendicular to the top surface of the support substrate 100. Thus, the fourth through holes TH4 may have inner surfaces perpendicular to the top surface of the support substrate 100.

Then, the etching process is performed with respect to the inner surfaces of the fourth through holes TH4 by using mechanical etching equipment, such as the needle, so that the inner surfaces of the fourth through holes TH4 are partially inclined. Thus, the inner surfaces of the fourth through holes TH4 may include the first surfaces TH4a, which are partially perpendicular to the top surface of the support substrate, and the second surfaces TH4b which are partially inclined with respect to the top surface of the support substrate.

In this case, the second surfaces TH4b of the fourth through holes TH4 are gradually enlarged in the direction from the support substrate 100 to the front electrode layer. That is, the second surfaces TH4b of the fourth through holes TH4 have the obtuse inclination angle or the acute inclination angle with respect to the top surface of the support substrate 100. For example, when the second surfaces TH4b of the fourth through holes TH4 are gradually enlarged in the direction from the support substrate 100 to the front electrode layer, the second surfaces TH4b of the fourth through holes TH4 have the inclination angle in the range of about 130° to about 170°.

Therefore, a spacing distance between the front electrode layer and the back electrode layer in the solar cell fabricated according to the above method may be increased, so that the front electrode layer may not come into contact with the back electrode layer even if the front electrode layer is partially melted due to the high energy of laser, thereby preventing the short between the front electrode layer and the back electrode layer.

In addition, the dead zone area may be diminished, so that the efficiency of the solar cell can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a support substrate;
   a back electrode layer on the support substrate;
   a light absorbing layer on the back electrode layer;

a buffer layer on the light absorbing layer;
a front electrode layer on the buffer layer;
a first through hole formed through the back electrode layer;
a second through hole formed through the light absorbing layer and the buffer layer;
a third through hole formed through the light absorbing layer, the buffer layer and the front electrode layer; and
a fourth through hole formed through the back electrode layer, the light absorbing layer, the buffer layer and the front electrode layer,
wherein the front electrode layer includes a connection part provided in the second through hole,
wherein the connection part is integrally formed with the front electrode layer,
wherein the third through hole exposes a top surface of the back electrode layer,
wherein the fourth through hole exposes a top surface of the support substrate and shorts an edge part of the solar cell with the outside,
wherein the fourth through hole comprises:
a first surface perpendicular to the top surface of the support substrate; and
a second surface inclined with respect to the top surface of the support substrate,
wherein the first surface is formed on the back electrode layer and a portion of the light absorbing layer, starting from the top surface of the support substrate,
wherein the second surface is extending from the first surface and is formed on a remaining portion of the light absorbing layer, the buffer layer and the front electrode layer, and
Wherein a first surface area of a lateral surface of the portion of the light absorbing layer exposed by the first surface of the fourth through hole is larger than a second surface area of the lateral surface of the remaining portion of the light absorbing layer exposed by the second surface of the fourth through hole.

2. The solar cell of claim 1, wherein the fourth through hole is formed in a direction different from a direction of at least one of the first through hole, the second through hole and the third through hole.

3. The solar cell of claim 1, wherein the fourth through hole has a width gradually enlarged in a direction from the support substrate to the front electrode layer.

4. The solar cell of claim 1, wherein the second surface is inclined with respect to the top surface of the support substrate by an inclination angle in a range of about 130° to about 170°.

5. A solar cell comprising:
a support substrate;
a back electrode layer on the support substrate;
a light absorbing layer on the back electrode layer;
a buffer layer on the light absorbing layer;
a front electrode layer on the buffer layer;
a first through hole formed through the back electrode layer;
a second through hole formed through the light absorbing layer and the buffer layer;
a third through hole formed through the light absorbing layer, the buffer layer and the front electrode layer;
a fourth through hole formed through the back electrode layer, the light absorbing layer, the buffer layer and the front electrode layer; and
an exposure surface formed in the fourth through hole and exposing the back electrode layer, the light absorbing layer, the buffer layer and the front electrode layer,
wherein the fourth through hole shorts an edge part of the solar cell with the outside, wherein the front electrode layer includes a connection part provided in the second through hole,
wherein the connection part is integrally formed with the front electrode layer,
wherein at least a portion of the exposure surface is inclined with respect to a top surface of the support substrate and creates an edge part of the solar cell,
wherein the exposure surface comprises:
a first exposure surface perpendicular to the top surface of the support substrate; and
a second exposure surface inclined with respect to the top surface of the support substrate,
wherein the first exposure surface exposes a lateral surface of the back electrode layer and a lateral surface of a portion of the light absorbing layer, starting from the top surface of the support substrate,
wherein the second exposure surface is extending from the first exposure surface and exposes the lateral surface of a remaining portion of the light absorbing layer, a lateral side of the buffer layer and a lateral side of the front electrode layer, and
Wherein a first surface area of the lateral surface of the portion of the light absorbing layer exposed by the first exposure surface is larger than a second surface area of the lateral surface of the remaining portion of the light absorbing layer exposed by the second exposure surface.

6. The solar cell of claim 5, wherein the second exposure surface is inclined with respect to the top surface of the support substrate by an inclination angle in a range of about 130° to about 170°.

7. The solar cell of claim 5, wherein a width of the fourth through hole is gradually enlarged in the direction from the support substrate to the front electrode layer, starting from the second exposure surface.

8. The solar cell of claim 5, wherein the exposure surface matches a lateral surface of the back electrode layer, the light absorbing layer, the buffer layer and the front electrode layer.

* * * * *